US005602785A

United States Patent [19]
Casper

[11] Patent Number: 5,602,785
[45] Date of Patent: Feb. 11, 1997

[54] P-CHANNEL SENSE AMPLIFIER PULL-UP CIRCUIT WITH A TIMED PULSE FOR USE IN DRAM MEMORIES HAVING NON-BOOTSTRAPPED WORD LINES

[75] Inventor: Stephen L. Casper, Boise, Id.

[73] Assignee: Micron Technology, Inc., Boise, Id.

[21] Appl. No.: 571,532

[22] Filed: Dec. 13, 1995

[51] Int. Cl.⁶ .................................. G11C 7/00
[52] U.S. Cl. .............. 365/189.11; 365/190; 365/205
[58] Field of Search .................. 365/189.11, 203, 365/205, 190, 149

[56] References Cited

U.S. PATENT DOCUMENTS

| | | | |
|---|---|---|---|
| 4,417,329 | 11/1983 | Mezawa et al. | 365/203 |
| 4,491,741 | 1/1985 | Parker | 307/200 B |
| 4,503,343 | 3/1985 | Ohuchi | 307/482 |
| 4,601,017 | 7/1986 | Mochizuki et al. | 365/189 |
| 4,656,612 | 4/1987 | Allan | 365/203 |
| 4,749,882 | 6/1988 | Morgan | 307/263 |
| 4,779,013 | 10/1988 | Tanaka | 307/443 |
| 4,802,129 | 1/1989 | Hoekstra et al. | 365/203 |
| 4,809,230 | 2/1989 | Konishi et al. | 365/189 |
| 4,914,631 | 4/1990 | Johnson et al. | 365/189.11 |
| 4,924,442 | 5/1990 | Chen et al. | 365/189.11 |
| 5,245,579 | 7/1993 | Ohta | 365/203 |
| 5,250,854 | 10/1993 | Lien | 307/296 |
| 5,276,647 | 1/1994 | Matsui et al. | 365/201 |
| 5,285,407 | 2/1994 | Gale et al. | 365/189.11 |
| 5,438,543 | 8/1995 | Yoon | 365/189.11 |
| 5,453,951 | 9/1995 | Proebsting | 365/189.11 X |

*Primary Examiner*—Joseph A. Popek
*Attorney, Agent, or Firm*—Seed and Berry LLP

[57] ABSTRACT

A pull-up circuit for a DRAM P-channel sense amplifier includes an NMOS transistor and a PMOS transistor connected in parallel with each other between a supply voltage and a pull-up node for the sense amplifier. The transistors are connected to a control circuit that turns on the NMOS transistor during a pull-up cycle and turns on the PMOS transistor only during the initial portion of the pull-up cycle.

19 Claims, 3 Drawing Sheets

P-CHANNEL SENSE AMPLIFIER PULL-UP CIRCUIT WITH A TIMED PULSE FOR USE IN DRAM MEMORIES HAVING NON-BOOTSTRAPPED WORD LINES

TECHNICAL FIELD

This invention generally relates to pull-up circuits for P-channel sense amplifiers used in dynamic memory arrays, and more particularly to a pull-up circuit for use in a DRAM array having non-bootstrapped word lines, the pull-up circuit having a timed-pulse-controlled PMOS transistor which couples the power supply bus to a pull-up node for high current flow to the node, and also an NMOS transistor which couples the power supply node to the pull-up node for maintenance of a desired voltage level.

BACKGROUND OF THE INVENTION

Referring now to FIG. 1, in a dynamic random access memory array having a folded bitline architecture, a plurality of rowlines, RL1–RL4, intersect a plurality of digit line pairs, DL1–DL2 and DL3–DL4. The intersection of each rowline and each digit line provides a memory cell location, and represents a uniquely addressable data bit. During a read operation, when the charge stored in a cell, MC1–MC8, is dumped to a one digit line of a digit line pair by activating the rowline associated with that cell, the other digit line of the digit line pair provides a reference voltage level. Each digit line pair has associated therewith both a P-channel sense amplifier that is responsible for pulling the digit line having the marginally higher voltage level up to a voltage level close to power supply voltage, and an N-channel sense amplifier that is responsible for pulling the digit line having the marginally lower voltage level down to a voltage level close to ground potential.

Since the maximum voltage that can be written to a DRAM cell ($V_M$) is equal to the voltage applied to word lines $V_{WL}$ minus a threshold voltage ($V_t$), $V_M$ is the optimum voltage level to which digit lines should be pulled up by the P-channel sense amplifiers. In the interest of longer refresh periods, lower soft error date, and more robust capability to distinguish between a stored "0" and a stored "1", it has been found useful to apply a voltage to the word lines that is greater than the power supply voltage $V_{CC}$ so that full power supply voltage can be written to a cell to represent a "1" value. U.S. Pat. Nos. 4,543,500 and 4,533,483, both of which issued to Joseph C. McAlexander, III, et al. described such a technique. In fact, the voltage applied to the word lines is typically considerably greater than a $V_t$ amount above $V_{CC}$, as this permits much faster voltage transitions. This is due to the fact that current flow through the access transistor ramps down rapidly as the voltage on the digit line approaches a $V_t$ amount below the word line voltage.

referring once again to FIG. 1, the DRAM array depicted therein has non-bootstrapped word lines (i.e., $V_{WL}$ is equal to the power supply voltage) and a prior art pull-up circuit for P-channel sense amplifiers. For such an array, $V_M$ is, of course, equal to $V_{CC}-V_t$. It will be noted that each digit line pair DL1–DL2 and DL3–DL4 in this DRAM array is shared by two memory sub-arrays, SA1 and SA2, with each digit line pair having a single P-channel sense amplifier, PS1 and PS2, located at one end of the digit line pair, and a single N-channel sense amplifier, NS1 and NS2, located between the two sub-arrays. Each P-channel sense amplifier (PS1 and PS2) is coupled to the pull-up node $P_{VT}$ through a PMOS write transistor (PW1 and PW2, respectively). Each PMOS write transistor is controlled by signal WT. Each N-channel sense amplifier (NS1 and NS2), on the other hand, is coupled to ground through an NMOS coupling transistor, NC1 and NC2, which are controlled by signal NLAT.

Still referring to FIG. 1, each sub-array is isolatable from the N-channel sense amplifier by means of a natural NMOS isolation transistor in each digit line, ISO1–ISO8. Each digit line in a digit line pair is coupled to separate input/output lines, IO1–IO2. The input/output lines IO1 and IO2 are coupled to multiplexers MUX1 and MUX2, respectively. By having two sub-arrays share a digit line pair, and by activating only one pair of isolation devices so that only the sub-array being addressed is coupled to the N-channel sense amplifier during sensing operations performed by the N-channel amplifier, digit line capacitance may be effectively halved. Once an N-channel sense amplifier has begun to pull one of its associated digit lines to ground potential, the remaining pair of isolation devices is activated in order to (in the case of the lower array) couple the digit lines to the P-channel sense amplifier, and (in the case of the upper array) couple the digit lines to the N-channel column decode transistors DQ1–DQ4. The column decode transistors are activated by a column decoder, CD, which is coupled to the address bus AB.

Still referring to FIG. 1, it will be further noted that a natural NMOS transistor QNA is placed between a PMOS active pull-up transistor QP and the pull-up node $P_{VT}$. The NMOS transistor QNA limits the pull-up voltage on node $P_{VT}$ to $V_{CC}$ minus the $V_1$ of the NMOS transistor QNA, which is approximately 0.6 volt. Were it not for the NMOS transistor QNA, the $P_{VT}$ node would be pulled up to a full $V_{CC}$, as would be the digit lines within the upper sub-array SA1. However, since the NMOS sense amplifier isolation transistor between the two sub-arrays ISO1–ISO4 would drop this voltage to $V_{CC}$ minus 0.6 volt, performance of the upper and lower sub-arrays would not be well balanced. NMOS cell access transistor ISO1–ISO8 typically have a $V_t$ of about 1.0 volt, and although it would be ideal, in once sense, to have the same $V_t$ drop in the pull-up circuit, the use of an NMOS transistor having a $V_t$ of 1.0 volt would increase pull-up times significantly. Thus, the use of the NMOS transistor QNA in the pull-up circuit is a compromise between the need for speed and the need to achieve operational voltage balance.

Most significantly, the architecture of FIG. 1 is characterized by slow pull-up times, particularly for the portions of the digit lines within the lower sub-array SA2. FIG. 2 graphically represents the pull-up voltages as a function of time. Plot A represents the voltage on the $P_{VT}$ node; plot B represents the voltage on portions of the digit lines within the upper sub-array SA1; and plot C represents the voltage on portions of the digit lines within the lower sub-array SA2.

What is needed is a new pull-up circuit for P-channel sense amplifiers, in a DRAM array having unbooted word lines, that will decrease the time required to pull up the voltage on all portions o the digit lines to $V_M$.

SUMMARY OF THE INVENTION

This invention is an improved pull-up circuit for P-channel sense amplifiers in dynamic random access memory arrays having non-bootstrapped word lines. The improved pull-up circuit has a delay-element-controlled PMOS pull-up transistor which couples the power supply bus to a pull-up node for high current flow to the node and to digit lines which are coupled to the node via PMOS isolation transistors. The pull-up circuit also has an NMOS pull-up transistor which coupled the power supply node to the pull-up node for maintenance of a desired voltage level equal to $V_{CC}$ minus the threshold voltage of the NMOS transistor. During the pull-up cycle, the PMOS pull-up transistor remains "on" for a period that is fixed by the delay element. The period is set such that sufficient charge is passed to the pull-up node while the PMOS pull-up transistor is "on" in order to achieve an equilibrium state potential of approximately $V_{CC}$ minus the $V_t$ of the NMOS pull-up transistor when the voltages on the pull-up node and digit lines stabilize the following cut-off of current flow through the PMOS pull-up transistor.

Figure 1:
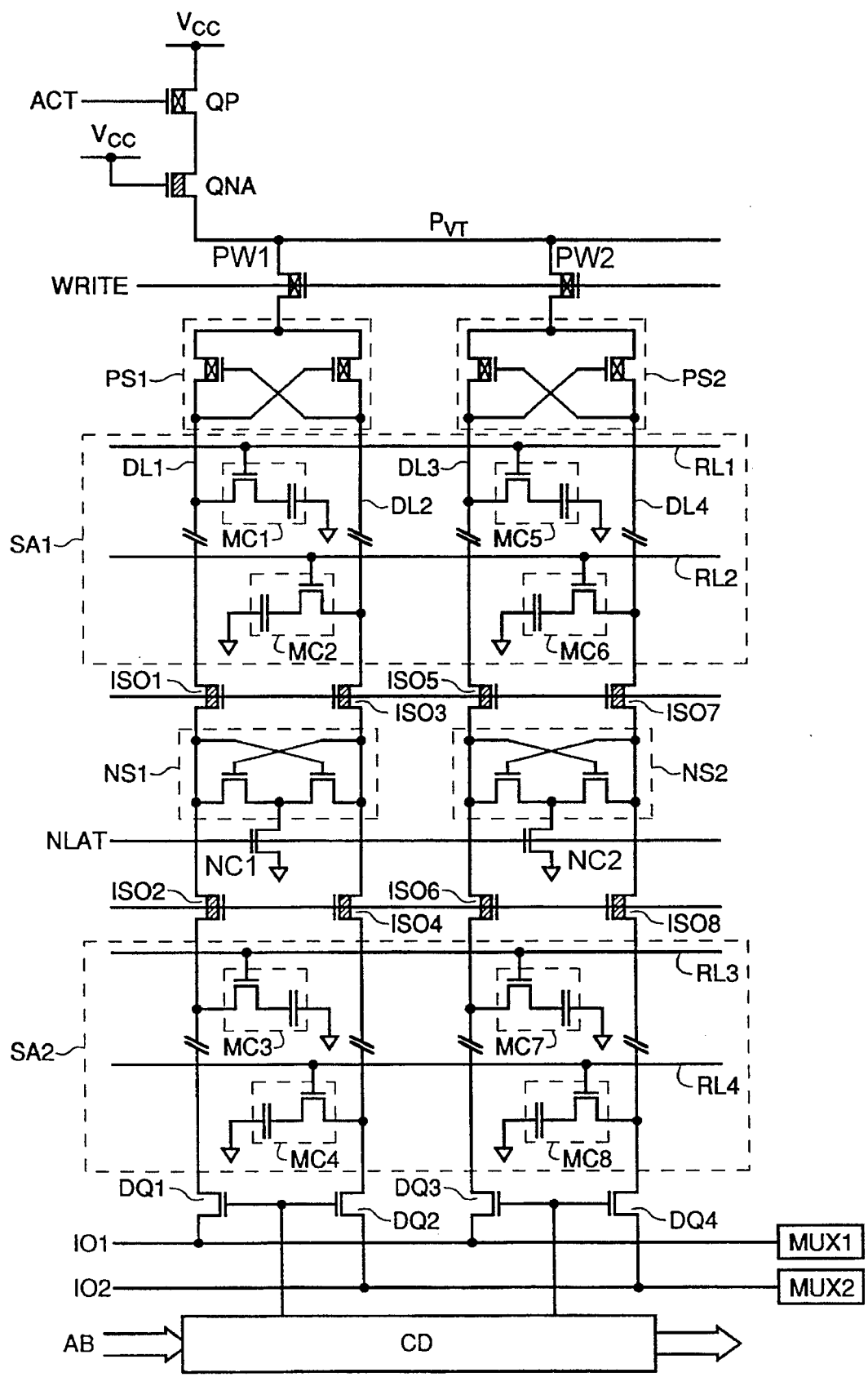
FIG. 1 is a schematic of a DRAM memory having unbooted word lines and a prior art P-channel sense amplifier pull-up circuit.

It should be noted that the drawings and graphs used to illustrate the invention are not to scale. They are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE INVENTION

Figure 3:
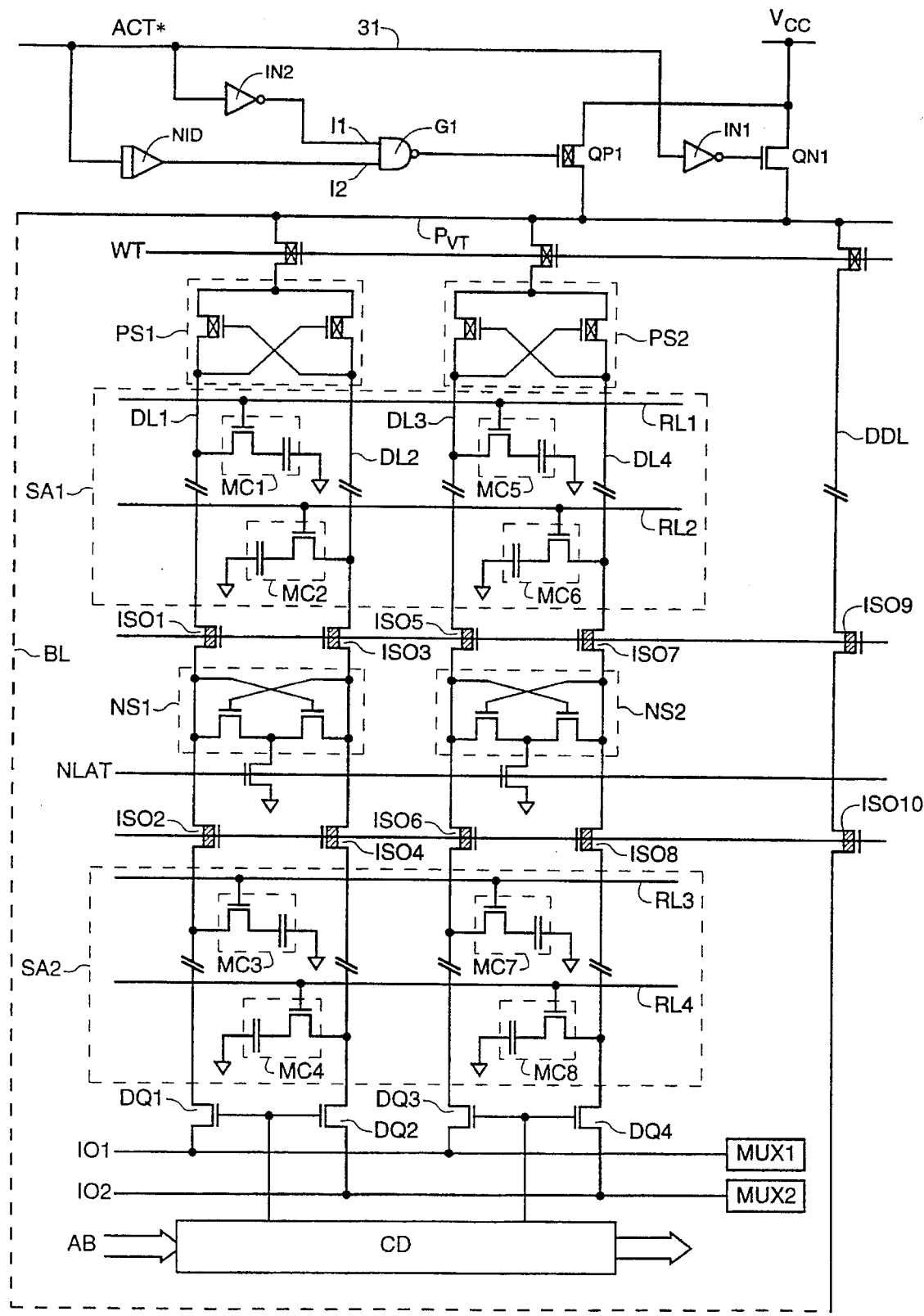
FIG. 3 is a schematic of a DRAM array having unbooted word lines and the new P-channel sense amplifier pull-up circuit.

Referring now to FIG. 3, the prior art pull-up circuit shown in FIG. 1 has been replaced with the new pull-up circuit in FIG. 3. The new pull-up circuit has both a PMOS pull-up transistor QP1 and an NMOS pull-up transistor QN1. During the pull-up cycle, the "on" time of PMOS transistor QP1 is controlled by a non-inverting delay element NID, the duration of which is set such that sufficient charge is passed to the pull-up node $P_{VT}$ while the PMOS pull-up transistor QP1 is "on" in order to achieve an equilibrium state potential of approximately $V_{CC}$ minus the $V_t$ of the NMOS pull-up transistor QN1 when the voltages on the pull-up node $P_{VT}$ and digit lines DL1, DL2, DL3, and DL4 stabilize following cut-off of current flow through the PMOS pull-up transistor QP1. The primary function of the NMOS pull-up transistor QN1 is to maintain a desired voltage level on the $P_{VT}$ node equal to $V_{CC}$ minus the threshold voltage of the NMOS transistor once current through the PMOS pull-up transistor QP1 is cut off.

Still referring to FIG. 3, the complement of an active pull-up control signal ACT* (the asterisk implies that in this particular case, the signal is active when in a low logic state) is coupled to the gate of NMOS pull-up transistor QN1. In this embodiment, inverter IN1 converts signal ACT* to its complement en route to the gate of transistor QN1. Thus, the transistor QN1 conducts whenever ACT* is low. The complement of control signal ACT* is also coupled to a first input I1 of a NAND gate G1. In this embodiment, inverter IN2 converts signal ACT* to its complement en route to input I1 of NAND gate G1. The second input of NAND gate G1 is coupled to control signal ACT* through non-inverting delay element NID. Thus, when signal ACT* goes low, the first input I1 changes to a logic value of "1" before the second input I2 can change from its logic state of "1" (the high value of ACT*). This combination results in NAND gate G1 producing an output of "0", which is coupled to the gate of PMOS pull-up transistor QP1, thus turning it "on". As soon as the low value of ACT* is passed through non-inverting delay element NID, the second input I2 changes to "0". At this point, the output of NAND gate G1 changes to "1", thus turning transistor QP1 "off". The duration of delay element NID is set such that while the PMOS pull-up transistor is "on", sufficient charge is transferred from the $V_{CC}$ bus to the $P_{VT}$ node in order to achieve an equilibrium state potential of approximately $V_{CC}$ minus the $V_t$ of the NMOS pull-up transistor when the voltages on the pull-up node and digit lines stabilize following cut-off of current flow through the PMOS pull-up transistor. The primary function of the PMOS pull-up transistor QP1 is thus to provide high current flow to the $P_{VT}$ node and digit lines DL1, DL2, DL3, and DL4, while the function of the NMOS pull-up transistor QN1 is to maintain a desired voltage level equal to $V_{CC}$ minus the threshold voltage of the NMOS transistor. It would, of course, be possible to increase the complexity of the pull-up circuitry so that transistor QN1 turns on as transistor QP1 turns off, as the primary function of transistor QN1 is primarily one of maintenance. This is, however, not a preferred embodiment of the invention as pull-up will be slowed somewhat, and should at least be considered an equivalent embodiment. It would be entirely obvious to one of even less than ordinary skill in the art that other equivalent logic arrangements will provide identical results, and should, therefore, be considered equivalent.

Figure 2:
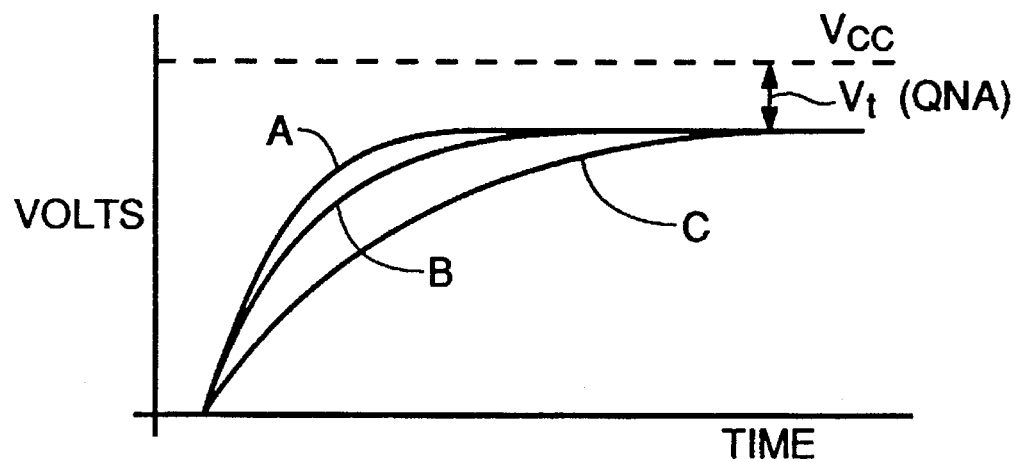
FIG. 2 is a graph of the voltage level of the $P_{VT}$ node, the portions of the digit lines within the upper sub-array, and the portions of the digit lines within the lower sub-array as a function of time for the prior art pull-up circuitry depicted in the DRAM array of FIG. 1.
Figure 4:
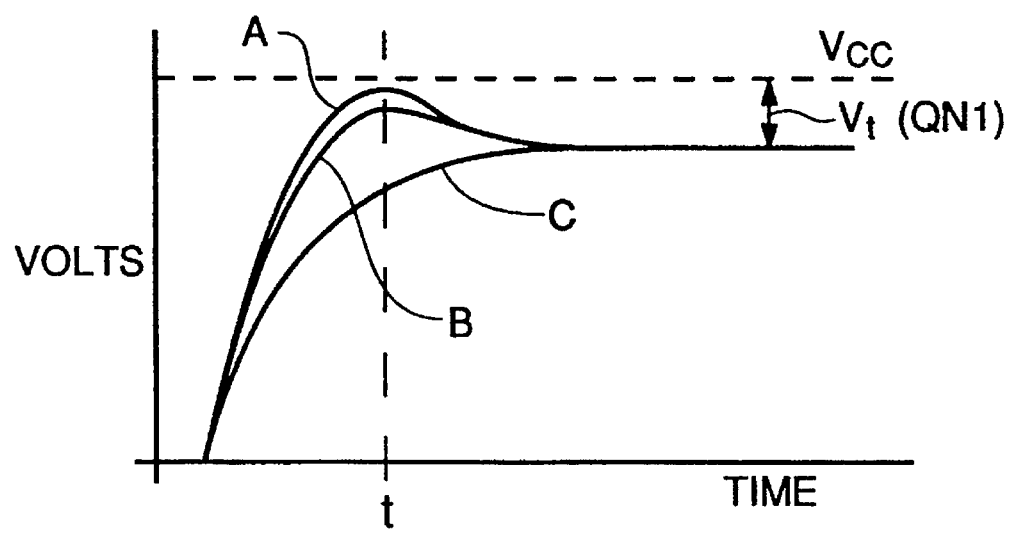
FIG. 4 is a graph of the voltage level on the $P_{VT}$ node, the portions of the digit lines within the upper sub-array, and the portions of the digit lines within the lower sub-array as a function of time for the new pull-up circuit.

FIG. 4 is similar to FIG. 2, except that the plots represent voltages as a function of time for the new pull-up circuit. It will be noted that the $P_{VT}$ node pulls up toward $V_{CC}$ more rapidly than the digit line portions in the upper sub-array SA1. The digit line portions in the upper sub-array SA1, in turn, pull up toward $V_{CC}$ more rapidly than the digit line portions in the lower sub-array SA2. This is because resistive and capacitive effects that hinder pull-up are greatest for the digit lines in the lower sub-array SA2 and least for the $P_{VT}$ node.

Still referring to FIG. 4, it will be noted that at the moment (t) that PMOS pull-up transistor QP1 is shut off, both the pull-up node $P_{VT}$ and the digit line portions within the upper sub-array have attained a voltage level in excess of the desired final value, which is $V_{CC}$ minus the $V_t$ of transistor QN1. However, at the same moment, the digit line portions in the lower sub-array SA2 have attained a voltage level less than the desired final value. Thus, the "on" time of the PMOS pull-up transistor QP1 is set such that an amount of charge is transferred from the power supply bus to the pull-up node $P_{VT}$ and to the portions of the digit lines in the upper sub-array SA1 that is sufficient to provide an overall voltage level on the $P_{VT}$ node and on all portions of the digit lines of $V_{CC}$ minus the $V_t$ of transistor QN1 once equilibrium has been established. After transistor QP1 is turned off, some of the charge on node $P_{VT}$ and on the digit lines in the upper sub-array transfers to the digit lines in the lower sub-array, resulting in an equilibrium voltage value that is equal to $V_{CC}-V_t$. Thus, the function of transistor QP1 is primarily to rapidly charge node $P_{VT}$, while the function of transistor QN1 is primarily to maintain the equilibrium voltage level by offsetting the effect of leakage.

While the invention has been taught with specific reference to the illustrative embodiments, it will be obvious to those having ordinary skill in the art of dynamic random access memory circuit design that changes can be made in form and detail without departing from the spirit and scope of the invention. The described embodiments are to be considered in all respects only as illustrative and not restrictive. The scope of the invention is, therefore, indicated by the appended claims rather than by the foregoing descriptions. All changes which come within the meaning and range of equivalency of the claims are to be embraced within their scope.

I claim:

1. A pull-up circuit for a P-channel sense amplifier in a dynamic random access memory, said P-channel sense amplifier being coupled to digit lines within an array, said pull-up circuit comprising:

a pull-up node coupled to the P-channel sense amplifiers;

a power supply bus;

an NMOS transistor coupling said power supply bus to said pull-up node, said NMOS transistor having a gate, a source, and a drain, said NMOS transistor allowing current to be conducted from said drain to said source when an NMOS turn-on signal is applied to the gate of said NMOS transistor;

a PMOS transistor coupling said power supply bus to said pull-up node, said PMOS transistor having a gate, a source, and a drain when a PMOS transistor allowing current to be conducted from said source to said drain when a PMOS turn-on signal is applied to the gate of said PMOS transistor; and a control circuit coupled to the respective gates of said NMOS and PMOS transistors, said control circuit receiving a pull-up control signal and, in response thereto, applying said PMOS turn-on signal to the gate of said PMOS transistor during the initial portion of said pull-up control signal and for a period that may be less than the duration of said pull-up control signal, said control circuit further responding to said pull-up control signal by applying said NMOS turn-on signal to the gate of said NMOS transistor at least for a period of time that said control circuit no longer applies said PMOS turn-on signal to the gate of said PMOS transistor whereby said PMOS transistor couples said power supply bus to said pull-up node during the initial portion of said pull-up control signal and said NMOS transistor thereafter couples said power supply pus to said pull-up node during the remaining portion of said pull-up control signal.

2. The pull-up circuit of claim 1 wherein said control circuit generates said NMOS turn-on signal during substantially the entire time that said control circuit receives said pull-up control signal so that said power supply bus is coupled to said pull-up node during the initial portion of said pull-up control signal by both said PMOS transistor and said NMOS transistor.

3. The pull-up circuit of claim 1 wherein said control circuit includes a timer circuit that is responsive to said pull-up control signal to output said PMOS turn-on signal for a predetermined period.

4. The pull-up circuit of claim 3 wherein said timer circuit comprises:

a logic gate having two inputs and an output coupled to the gate of said PMOS transistor, said logic gate generating said PMOS turn-on signal when said inputs are at the same logic level, one of said inputs being coupled to said pull-up control signal; and a delay circuit having an input receiving said pull-up control signal and an output coupled to the other input of said logic gate, the output of said delay circuit transitioning from one logic level to another a predetermined time after said pull-up control signal transitions from one logic level to another, said delay circuit applying a logic level to said logic gate responsive to said pull-up control signal that is different from the logic level at which said pull-up control signal is coupled to said logic gate whereby the inputs of said logic gate are at the same logic level only during the period from the start of said pull-up control signal to said predetermined time.

5. The pull-up circuit of claim 4 wherein said delay circuit is non-inverting so that the logic level of said pull-up control signal is generated at the output of said delay circuit said predetermined time after the start of said pull-up control signal, and wherein said control circuit further includes an inverter coupling said pull-up control signal to its respective input of said logic gate.

6. The pull-up circuit of claim 3 wherein said predetermined period is set to allow an amount of charge to pass from the power supply bus to the pull-up node that is required to establish a desired voltage level on the pull-up node and all portions of said digit lines once current flow through the PMOS transistor has terminated.

7. The pull-up circuit of claim 6 wherein said desired voltage level is approximately equal to a voltage level on said power supply bus minus a threshold voltage of said NMOS transistor.

8. A dynamic random access memory, comprising:

an array of memory elements each of which are selectively coupled to digit lines responsive to addressing signals;

a P-channel sense amplifier coupled to said digit lines;

an N-channel sense amplifier coupled to said digit lines;

a pull-up node coupled to the P-channel sense amplifiers;

a power supply bus;

an NMOS transistor coupling said power supply bus to said pull-up node, said NMOS transistor having a gate, a source, and a drain, said NMOS transistor allowing current to be conducted from said drain to said source when an NMOS turn-on signal is applied to the gate of said NMOS transistor;

a PMOS transistor coupling said power supply bus to said pull-up node, said PMOS transistor having a gate, a source, and a drain, said PMOS transistor allowing current to be conducted from said source to said drain when a PMOS turn-on signal is applied to the gate of said PMOS transistor; and a control circuit coupled to the respective gates of said NMOS and PMOS transistors, said control circuit receiving a pull-up control signal and, in response thereto, applying said PMOS turn-on signal to the gate of said PMOS transistor during the initial portion of said pull-up control signal and for a period that may be less than the duration of said pull-up control signal, said control circuit further responding to said pull-up control signal by applying said NMOS turn-on signal to the gate of said NMOS transistor at least for a period of time that said control circuit no longer applies said PMOS turn-on signal to the gate of said PMOS transistor whereby said PMOS transistor couples said power supply pus to said pull-up node during the initial portion of said pull-up control signal and said NMOS transistor thereafter couples said power supply pus to said pull-up node during the remaining portion of said pull-up control signal.

9. The dynamic random access memory of claim 8 wherein said control circuit generates said NMOS turn-on signal during substantially the entire time that said control circuit receives said pull-up control signal so that said power supply bus is coupled to said pull-up node during the initial portion of said pull-up control signal by both said PMOS transistor and said NMOS transistor.

10. The dynamic random access memory of claim 8 wherein said control circuit includes a timer circuit that is responsive to said pull-up control signal to output said PMOS turn-on signal for a predetermined period.

11. The dynamic random access memory of claim 10 wherein said timer circuit comprises:

a logic gate having two inputs and an output coupled to the gate of said PMOS transistor, said logic gate generating said PMOS turn-on signal when said inputs are at the same logic level, one of said inputs being coupled to said pull-up control signal; and a delay circuit having an input receiving said pull-up control signal and an output coupled to the other input of said logic gate, the output of said delay circuit transitioning from one logic level to another a predetermined time after said pull-up control signal transitions from one logic level to another, said delay circuit applying a logic level to said logic gate responsive to said pull-up control signal that is different from the logic level at which said pull-up control signal is coupled to said logic gate whereby the inputs of said logic gate are at the same logic level only during the period from the start of said pull-up control signal to said predetermined time.

12. The dynamic random access memory of claim 11 wherein said delay circuit is non-inverting so that the logic level of said pull-up control signal is generated at the output of said delay circuit said predetermined time after the start of said pull-up control signal, and wherein said control circuit further includes an inverter coupling said pull-up control signal to its respective input of said logic gate.

13. The dynamic random access memory of claim 10 wherein the period from the start of said pull-up control signal to said predetermined time is set to allow an amount of charge to pass from the power supply bus to the pull-up node that is required to establish a desired voltage level on the pull-up node and all portions of said digit lines once current flow through the PMOS transistor has terminated.

14. The dynamic random access memory of claim 13 wherein said desired voltage level is approximately equal to a voltage level on said power supply bus minus a threshold voltage of said NMOS transistor.

15. A method of driving a pull-up node coupled to a P-channel sense amplifier in a dynamic random access memory in which said P-channel sense amplifier is coupled to digit lines within an array, said method comprising coupling a power supply bus to said pull-up node through an NMOS transistor;

coupling said power supply bus to said pull-up node through a PMOS transistor;

causing said PMOS transistor to conduct current from said power supply bus to said pull-up node only during an initial portion of a pull-up cycle, the initial portion of said pull-up cycle being for a period that is less than the duration of said pull up cycle; and causing said NMOS transistor to conduct current from said power supply bus to said pull-up node at least during the portion of said pull-up cycle following said initial portion of said pull-up cycle.

16. The method of claim 15 wherein said NMOS transistor conducts current from said power supply bus to said pull-up node during substantially the entire duration of said pull-up cycle so that current flows from said power supply bus to said pull-up node by both said PMOS transistor and said NMOS transistor during the initial portion of said pull-up control signal.

17. The method of claim 15 wherein the initial portion of said pull-up cycle during which said PMOS transistor conducts current from said power supply bus to said pull-up node is of a predetermined duration.

18. The method of claim 15 wherein the duration of the initial portion of said pull-up cycle is set to allow an amount of charge to pass from the power supply bus to the pull-up node that is required to establish a desired voltage level on the pull-up node and all portions of said digit lines once current flow through said PMOS transistor has terminated at the termination of the initial portion of said pull-up cycle.

19. The method of claim 18 wherein said desired voltage level is approximately equal to a voltage level on said power supply bus minus a threshold voltage of said NMOS transistor.

* * * * *

UNITED STATES PATENT AND TRADEMARK OFFICE
CERTIFICATE OF CORRECTION

PATENT NO. : 5,602,785
DATED : February 11, 1997
INVENTOR(S) : Stephen L. Casper It is certified that error appears in the above-indentified patent and that said Letters Patent is hereby corrected as shown below:

In column 5, claim 1, line 33, please delete "when a" and insert therefor --, said--.

Signed and Sealed this

Nineteenth Day of August, 1997

*Attest:*

BRUCE LEHMAN

*Attesting Officer*  *Commissioner of Patents and Trademarks*